(12) United States Patent
Choi et al.

(10) Patent No.: US 12,108,632 B2
(45) Date of Patent: *Oct. 1, 2024

(54) ORGANIC LIGHT-EMITTING DIODE DISPLAY WITH PIXEL DEFINITION LAYERS

(71) Applicant: Apple Inc., Cupertino, CA (US)

(72) Inventors: Jaein Choi, Sunnyvale, CA (US); Hairong Tang, Los Gatos, CA (US); Gloria Wong, San Jose, CA (US); Sunggu Kang, San Jose, CA (US); Younggu Lee, San Jose, CA (US); Gwanwoo Park, Seoul (KR); Chun-Yao Huang, San Jose, CA (US); Andrew Lin, San Jose, CA (US); Cheuk Chi Lo, Belmont, CA (US); Enkhamgalan Dorjgotov, Sunnyvale, CA (US); Michael Slootsky, Santa Clara, CA (US); Rui Liu, San Jose, CA (US); Wendi Chang, Sunnyvale, CA (US); Cheng Chen, San Jose, CA (US); Yusuke Fujino, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/193,999

(22) Filed: Mar. 31, 2023

(65) Prior Publication Data

US 2023/0240100 A1 Jul. 27, 2023

Related U.S. Application Data

(63) Continuation of application No. 17/475,756, filed on Sep. 15, 2021, now Pat. No. 11,647,650, which is a
(Continued)

(51) Int. Cl.
  *H10K 59/122* (2023.01)
  *H10K 50/19* (2023.01)

(52) U.S. Cl.
  CPC .......... *H10K 59/122* (2023.02); *H10K 50/19* (2023.02)

(58) Field of Classification Search
  None
  See application file for complete search history.

(56) References Cited

U.S. PATENT DOCUMENTS 7,864,136 B2  1/2011  Matthies et al.
8,217,571 B2  7/2012  Lee et al.
(Continued)

FOREIGN PATENT DOCUMENTS

CN   108074951 A   5/2018
JP   2008091071 A   4/2008
(Continued)

*Primary Examiner* — Nduka E Ojeh
(74) *Attorney, Agent, or Firm* — Treyz Law Group, P.C.; Joseph F. Guihan; Jinie M. Guihan

(57) ABSTRACT

An organic light-emitting diode (OLED) display may have an array of organic light-emitting diode pixels that each have OLED layers interposed between a cathode and an anode. Voltage may be applied to the anode of each pixel to control the magnitude of emitted light. The conductivity of the OLED layers may allow leakage current to pass between neighboring anodes in the display. To reduce leakage current and the accompanying cross-talk in a display, the pixel definition layer may disrupt continuity of the OLED layers. The pixel definition layer may have an undercut to disrupt continuity of some but not all of the OLED layers. The undercut may be defined by three discrete portions of the pixel definition layer. The undercut may result in a void that is interposed between different portions of the OLED layers to break a leakage path formed by the OLED layers.

20 Claims, 9 Drawing Sheets

Related U.S. Application Data continuation of application No. 16/745,055, filed on Jan. 16, 2020, now Pat. No. 11,145,700.

(60) Provisional application No. 62/825,694, filed on Mar. 28, 2019.

(56) References Cited

U.S. PATENT DOCUMENTS

| | | | |
|---|---|---|---|
| 10,304,906 B2 | 5/2019 | Hack et al. | |
| 10,468,637 B2 | 11/2019 | Defranco et al. | |
| 11,145,700 B2* | 10/2021 | Choi | H10K 59/122 |
| 2012/0007067 A1 | 1/2012 | Kaneta et al. | |
| 2014/0103385 A1* | 4/2014 | Hatano | H10K 50/19 |
| | | | 438/28 |
| 2015/0048328 A1 | 2/2015 | Kato et al. | |
| 2016/0266295 A1 | 9/2016 | Cho et al. | |
| 2016/0268354 A1 | 9/2016 | Xiong et al. | |
| 2017/0309693 A1* | 10/2017 | Pang | H10K 50/131 |
| 2019/0058022 A1 | 2/2019 | Baik et al. | |

FOREIGN PATENT DOCUMENTS

| | | |
|---|---|---|
| JP | 2013033728 A | 2/2013 |
| JP | 2014044938 A | 3/2014 |
| JP | 2014082132 A | 5/2014 |
| JP | 2014232631 A | 12/2014 |
| KR | 1020130007971 A | 1/2013 |
| KR | 1020140140484 A | 12/2014 |
| WO | 2018212960 A1 | 11/2018 |

\* cited by examiner

ORGANIC LIGHT-EMITTING DIODE DISPLAY WITH PIXEL DEFINITION LAYERS

This application is a continuation of non-provisional patent application Ser. No. 17/475,756, filed Sep. 15, 2021, which is a continuation of non-provisional patent application Ser. No. 16/745,055, filed Jan. 16, 2020, now U.S. Pat. No. 11,145,700, which claims the benefit of provisional patent application No. 62/825,694, filed Mar. 28, 2019, which are hereby incorporated by reference herein in their entireties.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

To emit light from a given pixel in an organic light-emitting diode display, a voltage may be applied to the anode of the given pixel. Ideally, the voltage at the anode of the given pixel would not affect any neighboring pixels. However, the conductivity of the OLED layers over the anode may allow lateral conduction from the anode of the given pixel to the anodes of adjacent pixels. This may cause pixel cross-talk that allows nominally 'off' pixels to emit light due to an adjacent 'on' pixel's leakage. The pixel cross-talk may degrade display performance and cause a color-shift in the resulting image.

It may be desirable to reduce the distance between pixels in a display in order to increase the resolution of the display. However, pixel cross-talk due to lateral conduction through OLED layers may worsen as the distance between pixels decreases.

It would therefore be desirable to be able to provide improved displays for electronic devices.

SUMMARY

An electronic device may have a display such as an organic light-emitting diode display. The organic light-emitting diode (OLED) display may have an array of organic light-emitting diode pixels that each have OLED layers interposed between a cathode and an anode.

Each organic light-emitting diode pixel may have a respective anode. Voltage may be applied to the anode of each organic light-emitting diode pixel to control how much light is emitted from each organic light-emitting diode pixel. One or more of the OLED layers formed above the anode may be conductive. The conductivity of the OLED layers may allow leakage current to pass between neighboring anodes in the display.

To reduce leakage current and the accompanying cross-talk in a display, a pixel definition layer interposed between adjacent anodes in the display may be used to break the continuity of the OLED layers and prevent leakage current from passing between the adjacent pixels. The pixel definition layer may have an undercut defined by two or three discrete pixel definition layer portions. The undercut may result in a void being interposed between different portions of the OLED layers to break the continuity of the OLED layers.

The undercut may break the continuity of some but not all of the OLED layers in the display. Some of the OLED layers and a cathode layer in the display may remain continuous despite the presence of the undercut in the pixel definition layer.

DETAILED DESCRIPTION

Figure 1:
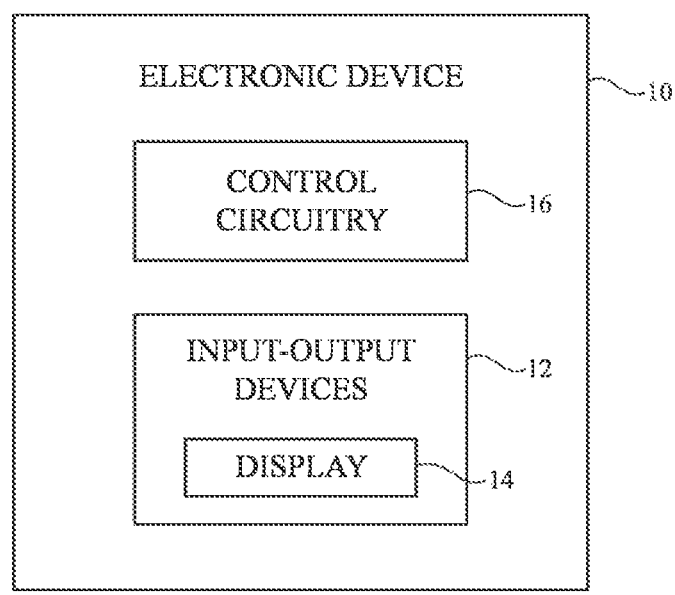
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
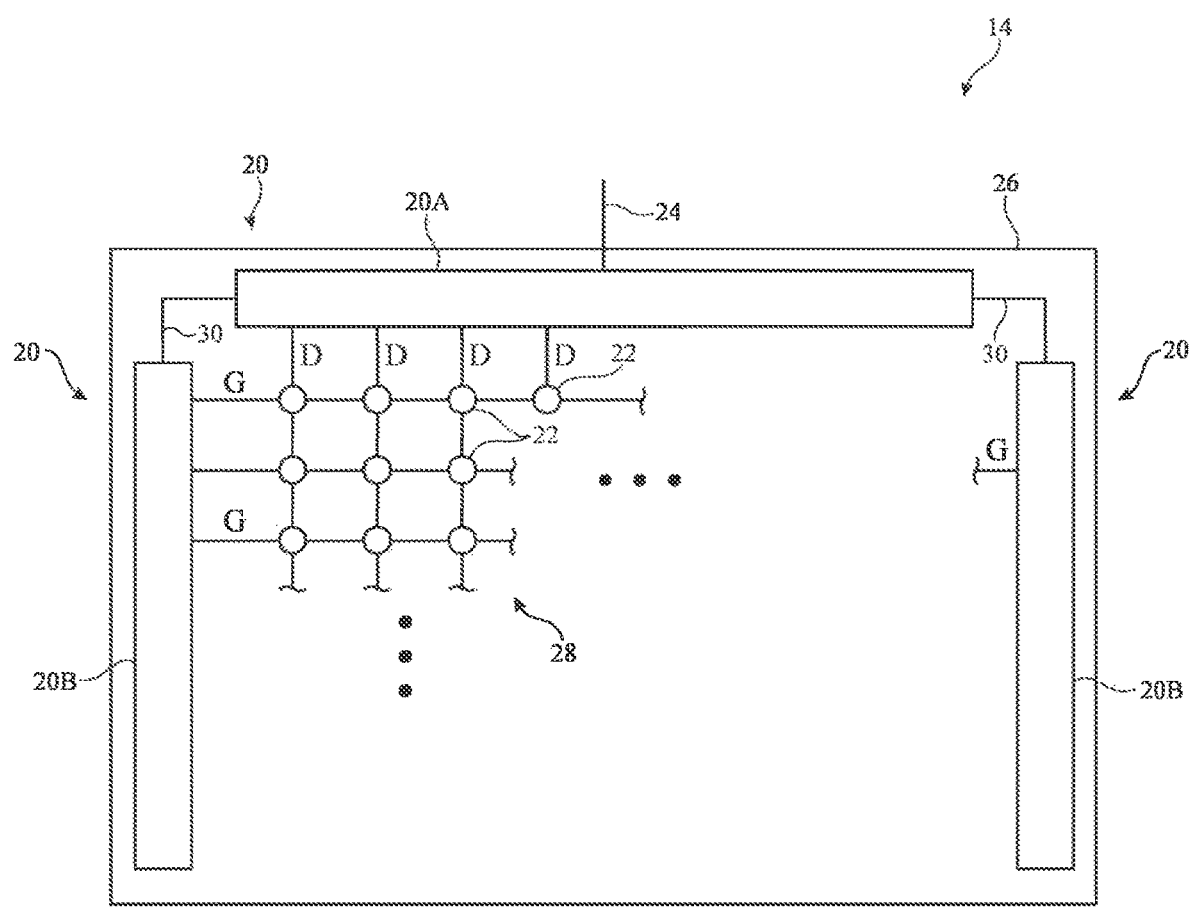
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
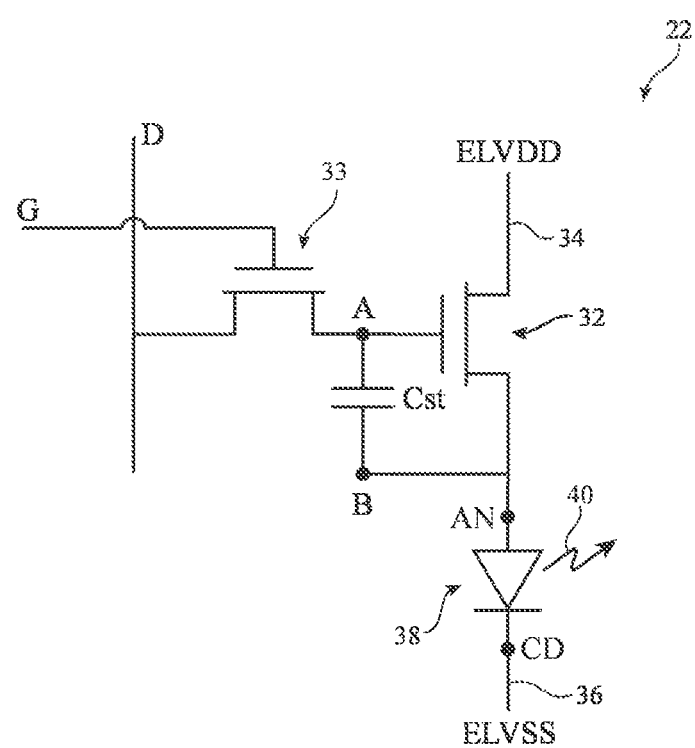
FIG. 3 is a diagram of an illustrative pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
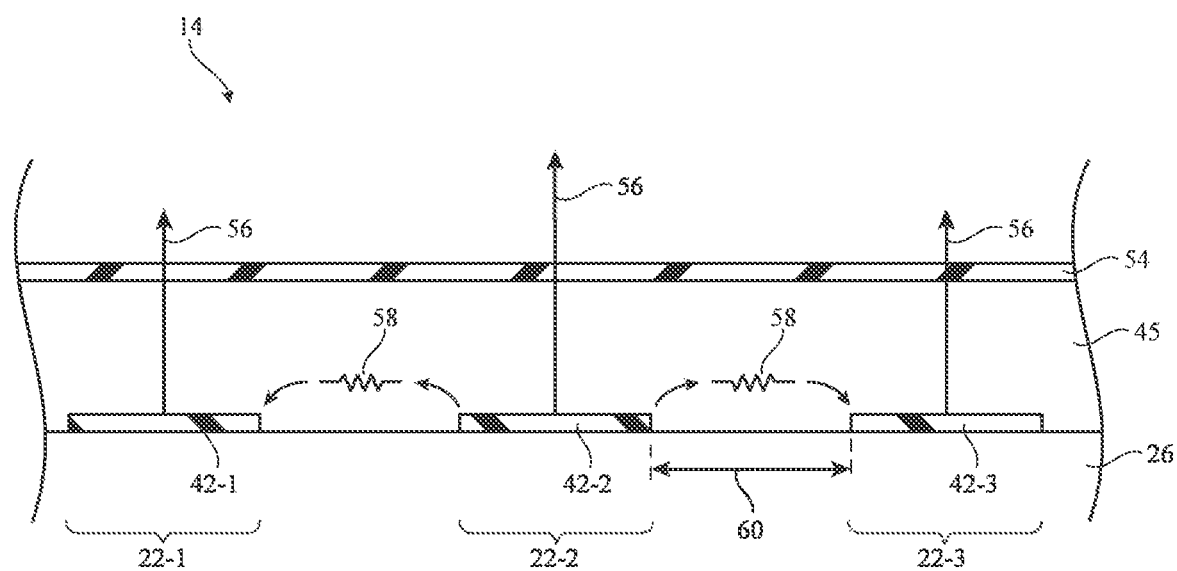
FIG. 4 is a cross-sectional side view of an illustrative organic light-emitting diode display showing lateral current leakage between adjacent anodes in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Anodes such as anodes 42-1, 42-2, and 42-3 may be formed on the substrate. Anodes 42-1, 42-2, and 42-3 may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an emissive layer (EML), an electron-transport layer (ETL), an electronic-injection layer (EIL), a charge generation layer (CGL), etc. Cathode 54 may be a conductive layer formed on the OLED layers 45. Cathode layer 54 may form a common cathode terminal (see, e.g., cathode terminal CD of FIG. 3) for all diodes in display 14. Cathode layer 54 may be formed from a transparent conductive material (e.g., indium tin oxide, a metal layer(s) that is sufficiently thin to be transparent, a combination of a thin metal and indium tin oxide, etc.). Each anode in display 14 may be independently controlled, so that each diode in display 14 can be independently controlled. This allows each pixel 22 to produce an independently controlled amount of light.

Anodes 42-1, 42-2, and 42-3 may each be associated with a respective pixel. For example, anode 42-1 may be associated with pixel 22-1, anode 42-2 may be associated with pixel 22-2, and anode 42-3 may be associated with pixel 22-3. To emit light from a pixel, a voltage may applied to the anode of the respective pixel. Take an example in which it is desired to emit light from pixel 22-2 (without emitting light from pixels 22-1 and 22-3). A voltage may be applied to anode 42-2, which causes light 56 to be emitted from pixel 22-2. As previously stated, it would be desirable if no light was emitted from pixels 22-1 and 22-3 as a result of voltage being applied to anode 42-2. However, as shown, leakage may occur through OLED layers 45 between anode 42-2 and anode 42-1, as well as between anode 42-2 and anode 42-3. There may be a resistance 58 (i.e., a resistance associated with the OLED layers) between anode 42-2 and the adjacent anodes that helps prevent leakage. The greater the resistance, the less leakage current will reach anodes 42-1 and 42-3. However, the resistance may not be large enough to totally eliminate leakage between anode 42-2 and anodes 42-1 and 42-3. As shown, even though pixels 22-1 and 22-3 are intended to be off, light 56 may be emitted from pixels 22-1 and 22-3. The resistance 58 between adjacent anodes may be reduced as the distance 60 between adjacent anodes is reduced. In order to maximize display resolution, it is desirable for the distance 60 between adjacent anodes to be small. However, this reduces the resistance 58 between anodes and increases cross-talk between pixels.

Although not shown in FIG. 4, display 14 may optionally include a pixel definition layer (PDL). The pixel definition layer may be formed from a dielectric material and may be interposed between adjacent anodes of the display. The pixel definition layer may have openings in which the anodes are formed, thereby defining the area of each pixel. Each of the following embodiments of an organic light-emitting diode display may optionally include a pixel definition layer. In some cases, the pixel definition layer may be shaped in a way that reduces leakage between adjacent pixels.

Figure 5:
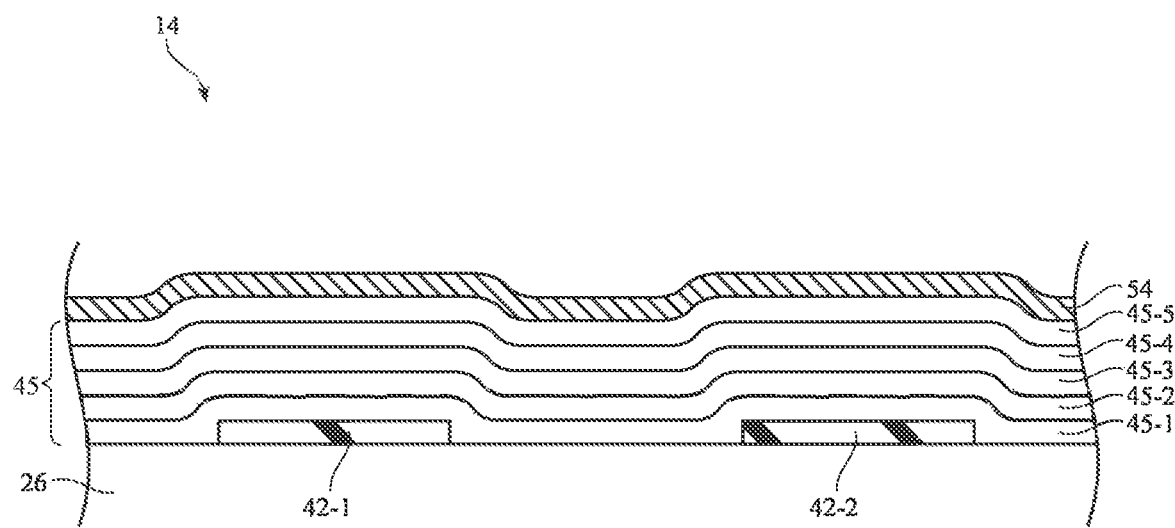
FIG. 5 is a cross-sectional side view of an illustrative organic light-emitting diode display showing different layers of the organic light-emitting diodes in accordance with an embodiment.

FIG. 5 is a cross-sectional side view of an illustrative display with organic light-emitting diode display pixels. FIG. 5 shows details of the OLED layers 45 from FIG. 4. As shown, OLED layers 45 (sometimes referred to as an organic stack-up, an organic stack, or an organic light-emitting diode stack) may include a plurality of conductive organic light-emitting diode layers. FIG. 5 shows five illustrative organic light-emitting diode layers. Organic light-emitting diode layer 45-1 is formed over the anodes 42-1 and 42-2. The distance between adjacent anodes within the display (e.g., an edge-to-edge distance between anodes 42-1 and 42-2) may be less than 100 microns, less than 50 microns, less than 20 microns, less than 10 microns, less than 5 microns, less than 3 microns, less than 2 microns, less than 1 micron, between 1 micron and 5 microns, between 0.5 microns and 10 microns, greater than 0.5 microns, greater than 0.1 microns, etc. Organic light-emitting diode layer 45-2 is formed over organic light-emitting diode layer 45-1, organic light-emitting diode layer 45-3 is formed over organic light-emitting diode layer 45-2, organic light-emitting diode layer 45-4 is formed over organic light-emitting diode layer 45-3, organic light-emitting diode layer 45-5 is formed over organic light-emitting diode layer 45-4, and cathode layer 54 is formed over organic light-emitting diode layer 45-5. Each organic light-emitting diode layer may sometimes be referred to as a conductive organic light-emitting diode layer, a common organic light-emitting diode layer, a laterally conductive organic light-emitting diode layer, etc.

There are numerous possible arrangements for the organic light-emitting diode layers in display 14. In one illustrative embodiment, organic light-emitting diode layer 45-1 may be a hole injection layer, organic light-emitting diode layer 45-2 may be a hole transport layer, organic light-emitting diode layer 45-3 may be an emissive layer, organic light-emitting diode layer 45-4 may be an electron transport layer, and organic light-emitting diode layer 45-5 may be an electronic injection layer. In another illustrative arrangement, the organic light-emitting diode may be inverted such that the cathode is patterned per-pixel and the anode is a common layer. In this case, the organic light-emitting diode layer 45-1 may be an electron injection layer, organic light-emitting diode layer 45-2 may be an electronic transport layer, organic light-emitting diode layer 45-3 may be an emissive layer, organic light-emitting diode layer 45-4 may be a hole transport layer, and organic light-emitting diode layer 45-5 may be a hole injection layer.

The examples of layers included between the anodes 42 and the cathode 54 in FIG. 5 are merely illustrative. If desired, the layers may include an electron blocking layer, a charge generation layer, a hole blocking layer, etc. The hole injection layer and hole transport layer may collectively be referred to as a hole layer. The electron transport layer and the electron injection layer may collectively be referred to as an electron layer. In one illustrative arrangement, organic light-emitting diode layer 45-1 may be a hole layer, organic light-emitting diode layer 45-2 may be a first emissive layer, organic light-emitting diode layer 45-3 may be a charge generation layer (e.g., a layer that includes an n-doped layer and a p-doped layer for injection of electrons and holes in a tandem diode), organic light-emitting diode layer 45-4 may be a second emissive layer, and organic light-emitting diode layer 45-5 may be an electron layer.

In general, any desired layers may be included in between the anodes and the cathode and any layer that is formed across the display and that has a non-zero conductivity may be considered a common laterally conductive layer. Each layer in OLED layers 45 may be formed from any desired material. In some embodiments, the layers may be formed from organic material. However, in some cases one or more layers may be formed from inorganic material or a material doped with organic or inorganic dopants. The emissive layers may include organic electroluminescent material.

In subsequent embodiments, a patterned anode is depicted as being positioned below a common cathode layer. However, it should be understood that in each of these embodiments the anode and cathode may be inverted as previously described.

Regardless of the particular arrangement of the organic light-emitting diode layers, the presence of common laterally conductive layers may present an opportunity for leakage current from one diode to flow laterally into an adjacent diode, thereby potentially disrupting the adjacent diode. The conductivity of each layer may contribute to the amount of leakage current that passes to adjacent diodes. For example, an organic light-emitting diode layer with a low resistivity (and therefore high conductivity) may be susceptible to passing leakage current to adjacent pixels. An organic light-emitting diode layer with a high resistivity (and therefore low conductivity) may be less susceptible to passing leakage current to adjacent pixels. As the distance between the pixels is reduced (to increase the resolution of the display), the threshold of conductivity that produces detectable leakage may become small. In order to reduce leakage between anodes through the organic light-emitting diode layers, it may be desirable to form discontinuities in the organic light-emitting diode layers between adjacent anodes. These discontinuities will disrupt the conductive leakage paths in the organic light-emitting diode layers to prevent leakage current from passing through the organic light-emitting diode layers.

Forming discontinuities in the organic light-emitting diode layers may mitigate leakage current between adjacent pixels. However, it may be desirable for cathode layer 54 to remain a continuous layer across the pixels. Additionally, as previously mentioned, some of the organic light-emitting diode layers may have higher conductivities than other organic light-emitting diode layers. Therefore, the display may be optimized to have discontinuities in the high conductivity organic light-emitting diode layers and a continuous cathode layer across the display.

Figure 6:
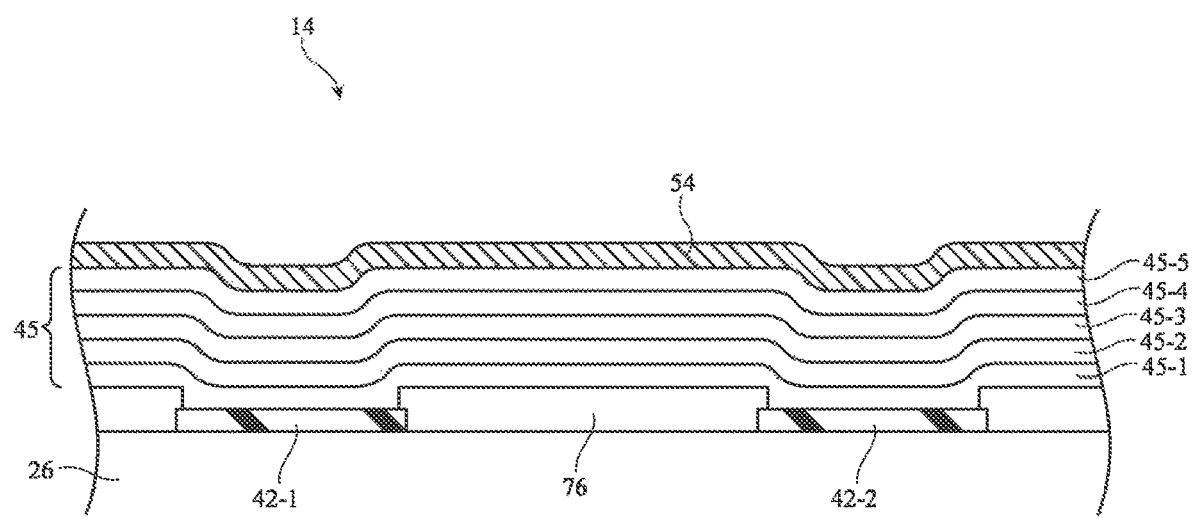
FIG. 6 is a cross-sectional side view of an illustrative organic light-emitting diode display with a pixel definition layer in accordance with an embodiment.

In some cases, a pixel definition layer may be used to form the discontinuities in some of the organic light-emitting diode layers while maintaining continuity in the cathode layer. FIG. 6 is a cross-sectional side view of an illustrative organic light-emitting diode display with a pixel definition layer. As shown in FIG. 6, pixel definition layer 76 may be formed on substrate 26 between the anodes of the display. The pixel definition layer may be opaque and therefore may define the area of each pixel that emits light. The pixel definitional layers may be formed from any desired material. The pixel definition layers may be formed from one or more materials (e.g., silicon nitride, silicon dioxide, etc.). The pixel definitional layers may also be formed from an organic material if desired. The shape of each pixel definitional layer may create discontinuities in the overlying organic light-emitting diode display layers, as will be shown in more detail in FIGS. 7-9.

As previously discussed, it may be desirable to create discontinuities in one or more of the organic light-emitting diode layers in the display (to prevent lateral leakage through the organic light-emitting diode layers). However, it may also be desirable to maintain continuity in one or more other layers in the display (e.g., cathode 54). Therefore, the shape of the pixel definition layers may be designed such that one or more desired organic light-emitting diode layers deposited over the pixel definition layer has discontinuities whereas additional organic light-emitting diode layers and/or cathode 54 deposited over the pixel definition layers does not have discontinuities. Detailed views of pixel definition layers that are shaped to form discontinuities in select overlying layers are shown in FIGS. 7 and 8.

Figure 7:
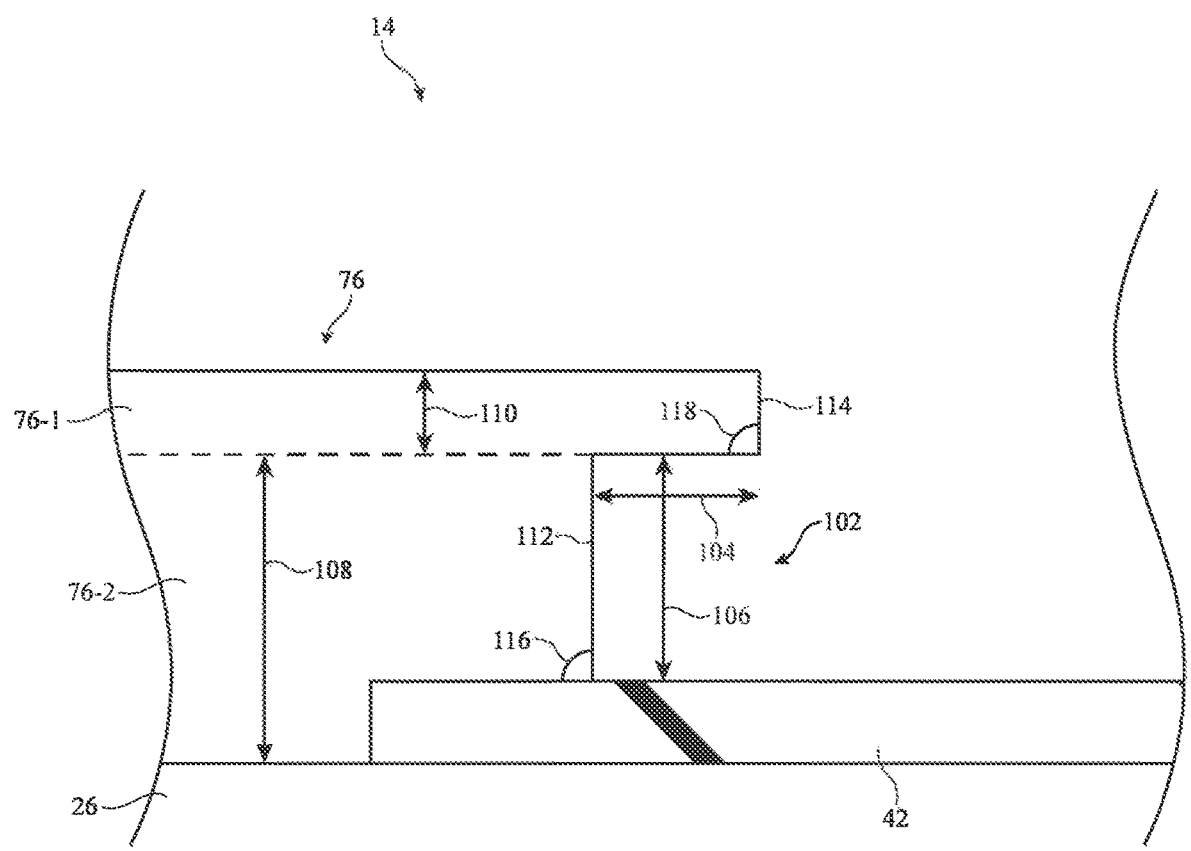
FIG. 7 is a cross-sectional side view of an illustrative organic light-emitting diode display with a pixel definition layer that is formed from two discrete portions and that causes discontinuities in at least one organic light-emitting diode layer in accordance with an embodiment.
Figure 8:
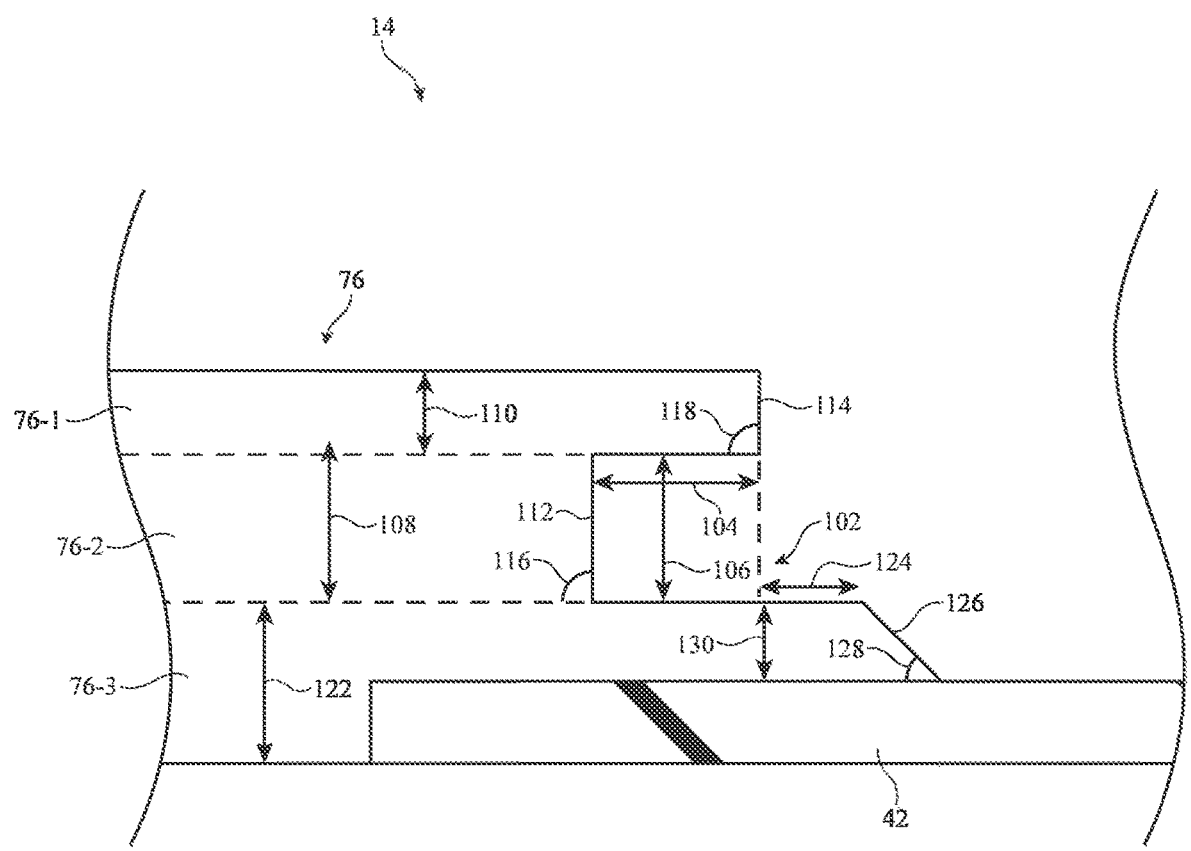
FIG. 8 is a cross-sectional side view of an illustrative organic light-emitting diode display with a pixel definition layer that is formed from three discrete portions and that causes discontinuities in at least one organic light-emitting diode layer in accordance with an embodiment.

FIG. 7 is a cross-sectional side view of an illustrative pixel definition layer that may form discontinuities in organic light-emitting diode layers in the display. As shown in FIG. 7, pixel definition layer (PDL) 76 has an undercut 102. Undercut 102 may sometimes also be referred to as recess 102, cavity 102, hole, 102, indentation 102, etc. The undercut is a void in the edge of the pixel definition layer material that is covered by a portion of the pixel definition layer. As shown in FIG. 7, undercut 102 may have a width 104 and a height 106. In this arrangement, width 104 is defined as the distance between the edge of portion 76-1 of the pixel definition layer and the edge of portion 76-2 of the pixel definition layer. Height 106 is defined as the distance between a lower surface of portion 76-1 of the pixel definition layer and anode 42. Width 104 and height 106 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 15 nanometers, more than 20 nanometers, between 10 and 100 nanometers, etc.). Height 106 and width 104 may the same or may be different. In one example, height 106 may be less than 50 nanometers and width 104 may be greater than 15 nanometers.

In the example of FIG. 7, pixel definition layer 76 may be formed from portions 76-1 and 76-2 (sometimes referred to as layers 76-1 and 76-2) that are formed from different materials. In other words, portions 76-1 and 76-2 may be deposited separately when the pixel definition layer is formed. Each portion may be formed from any desired material (e.g., silicon nitride, silicon dioxide, an organic material, etc.). In one example, portion 76-1 may be formed from silicon dioxide ($SiO_2$) and portion 76-2 may be formed from silicon nitride (SiN). This example is merely illustrative.

Portion 76-1 may have a thickness 110 and portion 76-2 may have a thickness 108. Thicknesses 108 and 110 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). Thicknesses 108 and 110 may be the same or may be different. It should be noted that, due to the presence of anode 42, the thickness of pixel definition layer portion 76-2 may vary. For example, in FIG. 7 the portion 76-2 has a thickness 108 in portions over regions of substrate 26 that do not include anode 42. Portion 76-2 has a thickness that is smaller than thickness 108 (e.g., equal to height 106) in portions that overlap anode 42. This example is merely illustrative. If desired, portion 76-2 may have uniform thickness (with a step-change over the edge of the anode).

The angles of the edges of portions 76-1 and 76-2 may be selected to control the discontinuities of the organic light-emitting diode layers. As shown in FIG. 7, portion 76-2 has an edge surface 112 that is at an angle 116 relative to the planar upper surface of anode 42 (and relative to the planar lower surface of portion 76-2). Portion 76-1 has an edge surface 114 that is at an angle 118 relative to the planar upper surface of anode 42 (and relative to the planar lower surface of portion 76-1). Angles 116 and 118 may be the same or may be different. Each of the angles may be any desired angle (e.g., between 45° and 90°, between 25° and 135°, between 45° and 55°, between 55° and 65°, between 75° and 85°, between 85° and 95° between 45° and 65°, between 70° and 90°, between 10° and 45°, less than 90°, etc.).

Any of the dimensions of the pixel definition layer may be tuned to impart the desired discontinuities on the organic light-emitting diode layers formed over the pixel definition layer. For example, thicknesses 108 and 110 of each pixel definition layer portion, the width 104 and height 106 of undercut 102, angles 116 and 118, etc. may all be selected such that desired discontinuities are formed when the organic light-emitting diode layers are deposited over the pixel definition layer. The pixel definition layer portions and organic light-emitting diode layers may be formed using vapor deposition techniques, photolithography techniques, etc. To modify the dimensions of the pixel definition layer portions, exposure levels, mask profile, deposition pressure, gas composition, and/or other desired manufacturing properties may be tuned.

FIG. 8 is a cross-sectional side view of another illustrative pixel definition layer that may form discontinuities in organic light-emitting diode layers in the display. As shown in FIG. 8, pixel definition layer (PDL) 76 again has an undercut 102. Undercut 102 may sometimes also be referred to as recess 102, cavity 102, hole, 102, indentation 102, etc. The undercut is a void in the pixel definition layer material that is still covered by a portion of the pixel definition layer. As shown in FIG. 8, undercut 102 may have a width 104 and a height 106. In this arrangement, width 104 is defined as the distance between the edge of portion 76-1 of the pixel definition layer and the edge of portion 76-2 of the pixel definition layer. Height 106 is defined as the distance between a lower surface of portion 76-1 of the pixel definition layer and an upper surface of portion 76-3 of the pixel definition layer. Width 104 and height 106 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). Height 106 and width 104 may the same or may be different. In one example, height 106 may be less than 50 nanometers, width 104 may be greater than 20 nanometers, thickness 108 may be less than 50 nanometers, thickness 110 may be less than 20 nanometers, and thickness 122 may be less than 50 nanometers.

In the example of FIG. 8, pixel definition layer 76 may be formed from portions 76-1, 76-2, and 76-3 (sometimes referred to as layers 76-1, 76-2, and 76-3) that are formed from different materials. In other words, portions 76-1, 76-2, and 76-3 may be deposited separately when the pixel definition layer is formed. Each portion may be formed from any desired material (e.g., silicon nitride, silicon dioxide, an organic material, etc.). In one example, portions 76-1 and 76-3 may be formed from silicon dioxide ($SiO_2$) and portion 76-2 may be formed from silicon nitride (SiN). This example is merely illustrative.

Portion 76-1 may have a thickness 110, portion 76-2 may have a thickness 108, and portion 76-3 may have a thickness 122. Thicknesses 108, 110, and 122 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). Thicknesses 108, 110, and 122 may be the same or may be different. It should be noted that, due to the presence of anode 42, the thickness of pixel definition layer portion 76-3 may vary. For example, in FIG. 8 the portion 76-3 has a thickness 122 in portions over regions of substrate 26 that do not include anode 42. Portion 76-3 has a thickness 130 that is smaller than thickness 122 in portions that overlap anode 42. Thickness 130 of portion 76-3 in the reduced thickness region may be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). This example is merely illustrative. If desired, portion 76-3 may have uniform thickness (with a step-change over the edge of the anode).

The angles of the edges of portions 76-1, 76-2, and 76-3 may be selected to control the discontinuities of the organic light-emitting diode layers. As shown in FIG. 8, portion 76-3 has an edge surface 126 that is at an angle 128 relative to the planar upper surface of anode 42 (and relative to the planar lower surface of portion 76-3). Portion 76-2 has an edge surface 112 that is at an angle 116 relative to the planar upper surface of anode 42 (and relative to the planar lower surface of portion 76-2). Portion 76-1 has an edge surface 114 that is at an angle 118 relative to the planar upper surface of anode 42 (and relative to the planar lower surface of portion 76-1). Angles 116, 118, and 128 may be the same or may be different. Each of the angles may be any desired angle (e.g., between 45° and 90°, between 25° and 135°, between 45° and 55°, between 55° and 65°, between 75° and 85°, between 85° and 95° between 45° and 65°, between 70° and 90°, between 10° and 45°, less than 90°, etc.).

In FIG. 8, a portion of layer 76-3 may not be covered by layer 76-1. Said another way, layer 76-3 extends past the edge of layer 76-1 (e.g., towards the center of the anode). The width 124 of the portion of layer 76-3 that is not covered by layer 76-1 may be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). The portion of layer 76-3 that is not covered by layer 76-1 may be referred to as a step portion of the pixel definition layer. Width 124 may be greater than 40 nanometers.

Any of the dimensions of the pixel definition layer may be tuned to impart the desired discontinuities on the organic light-emitting diode layers formed over the pixel definition layer. For example, thicknesses 108, 110, 122, and 130 of each pixel definition layer portion, the width 104 and height 106 of undercut 102, angles 116, 118, 128, step portion width 124, etc. may all be selected such that desired discontinuities are formed when the organic light-emitting diode layers are deposited over the pixel definition layer. The pixel definition layer portions and organic light-emitting diode layers may be formed using vapor deposition techniques, photolithography techniques, etc. To modify the dimensions of the pixel definition layer portions, exposure levels, mask profile, deposition pressure, gas composition, and/or other desired manufacturing properties may be tuned.

Figure 9:
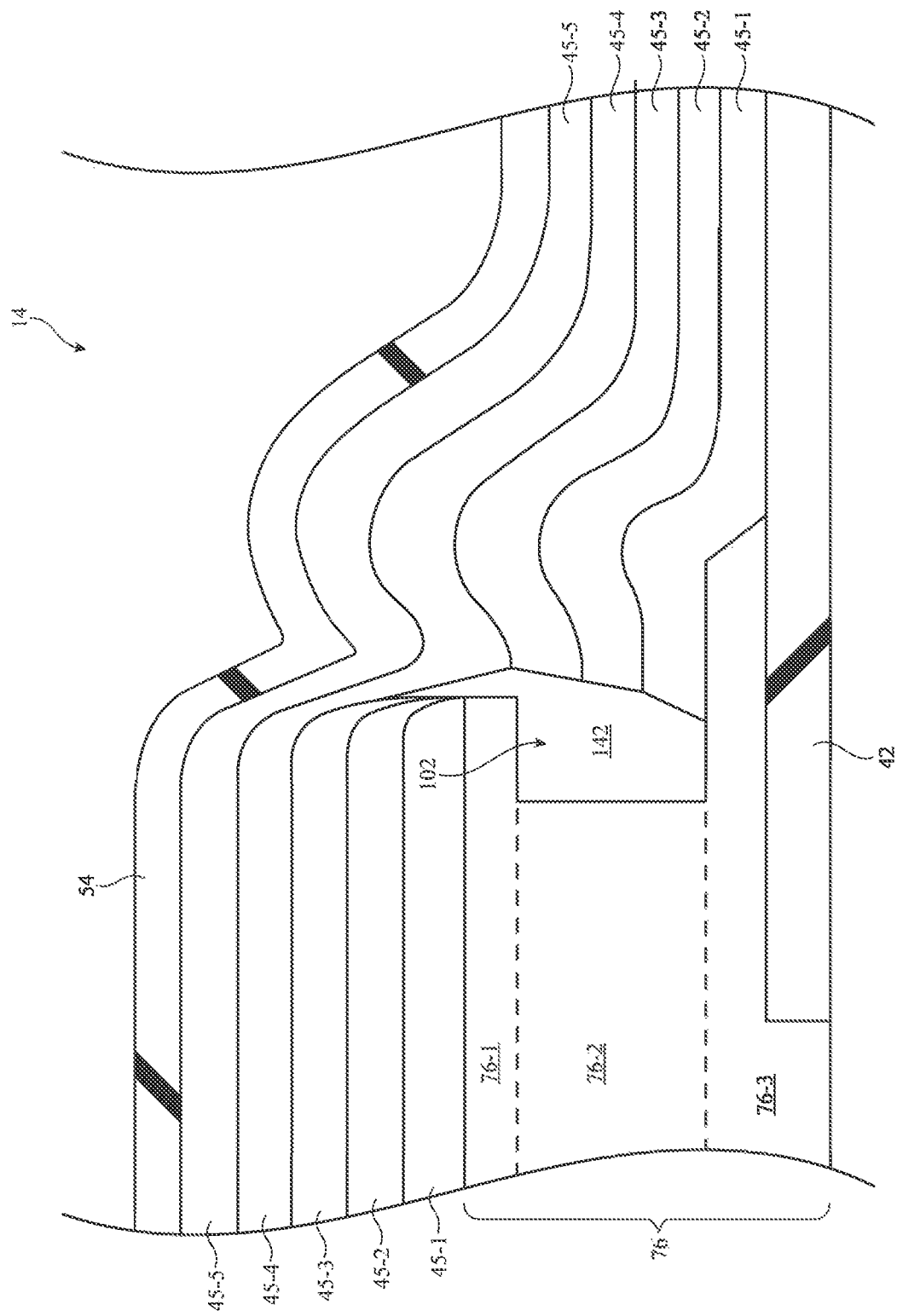
FIG. 9 is a cross-sectional side view of an illustrative organic light-emitting diode display showing how the undercut in the pixel definition layer of FIG. 8 may cause a void to be interposed between portions of at least one organic light-emitting diode layer in accordance with an embodiment.

FIG. 9 is a cross-sectional side view showing how discontinuities may be formed in the organic light-emitting diodes deposited over a pixel definition layer. The pixel definition layer of FIG. 8 is depicted in FIG. 9. However, it should be understood that the pixel definition layer of FIG. 7 may be used instead if desired. As shown in FIG. 9, organic light-emitting diode layers 45-1, 45-2, 45-3, 45-4, and 45-5 are formed over the pixel definition layer 76 and anode 42. Cathode layer 54 is formed over the organic light-emitting diode layers.

The presence of undercut 102 may result in a void 142 present between the pixel definition layer and organic light-emitting diode layers. In the example of FIG. 9, void 142 (sometimes referred to as air-filled void 142, air-filled region 142, insulator-filled void 142, etc.) forms discontinuities between respective portions of organic light-emitting diode layer 45-1. The void may be filled with air or any other desired material. The void also forms discontinuities between respective portions of organic light-emitting diode layer 45-2. Finally, the void forms discontinuities between respective portions of organic light-emitting diode layer 45-3. In this way, lateral leakage through organic light-emitting diode layers 45-1, 45-2, and 45-3 may be prevented. While forming discontinuities in organic light-emitting diode layers 45-1, 45-2, and 45-3, the void may not form discontinuities between organic light-emitting diode layer 45-4, organic light-emitting diode layer 45-5, and cathode layer 54.

The shape of pixel definition layer 76 may determine how many of the organic light-emitting diode layers are interrupted by void 142. In FIG. 9, three organic light-emitting diode layers (45-1, 45-2, and 45-3) are interrupted by void 142 whereas two organic light-emitting diode layers (45-4 and 45-5) are not interrupted by void 142. As previously mentioned, in one illustrative arrangement, organic light-emitting diode layer 45-1 may be a hole injection layer, organic light-emitting diode layer 45-2 may be a hole transport layer, organic light-emitting diode layer 45-3 may be an emissive layer, organic light-emitting diode layer 45-4 may be an electron transport layer, and organic light-emitting diode layer 45-5 may be an electronic injection layer. In another illustrative arrangement, organic light-emitting diode layer 45-1 may be a hole layer, organic light-emitting diode layer 45-2 may be a first emissive layer, organic light-emitting diode layer 45-3 may be a charge generation layer, organic light-emitting diode layer 45-4 may be a second emissive layer, and organic light-emitting diode layer 45-5 may be an electronic layer.

Organic light-emitting diode layer 45-3 (e.g., the last layer interrupted by the void) may have a higher conductivity than organic light-emitting diode layer 45-4 (e.g., the first layer that is not interrupted by the void). In other words, the discontinuities in the organic light-emitting diode layers may be propagated to ensure discontinuity of a high conductivity organic light-emitting diode layer. This may effectively reduce lateral leakage between pixels in the display. Continuity in the remaining organic light-emitting diode layers (e.g., 45-4 and 45-5) may be maintained while still ensuring satisfactory light leakage levels.

In general, each of the organic light-emitting diode layers may have any desired conductivity, and discontinuities may be propagated through the organic light-emitting diode layers by pixel definition layer 76 until lateral light leakage is reduced to satisfactory levels (while maintaining continuity of the cathode layer). In other words, in an example where organic light-emitting diode layer 45-3 has a low conductivity and organic light-emitting diode layer 45-2 has a high conductivity (e.g., higher than layer 45-3), the discontinuities may only be present in organic light-emitting diode layers 45-1 and 45-2 (while organic light-emitting diode layers 45-3, 45-4, and 45-5 remain continuous). In yet another example where organic light-emitting diode layer 45-2 has a low conductivity and organic light-emitting diode layer 45-1 has a high conductivity (e.g., higher than layer 45-2), the discontinuities may only be present in organic light-emitting diode layer 45-1 (while organic light-emitting diode layers 45-2, 45-3, 45-4, and 45-5 remain continuous).

The pixel definition layer arrangements of FIGS. 7 and 8 may enable high yield in manufacturing the organic light-emitting diode displays. Displays may be manufactured at the wafer or mother-glass level then later cut into individual displays. In this type of process, the robust designs of FIGS. 7 and 8 may ensure that displays across the wafer or mother-glass have satisfactory display performance (e.g., with reduced lateral leakage and cathode continuity).

The foregoing is merely illustrative and various modifications can be made by those skilled in the art without departing from the scope and spirit of the described embodiments. The foregoing embodiments may be implemented individually or in any combination.

What is claimed is:

1. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
at least two layers on the substrate that are interposed between the first and second patterned electrodes, wherein the at least two layers comprise a first layer that is formed on the first patterned electrode and that has an edge surface at a non-orthogonal angle relative to an upper surface of the first patterned electrode, wherein the at least two layers comprise a second layer formed over the first layer, wherein the first layer is interposed between the second layer and the first patterned electrode, and wherein the edge surface is not directly overlapped by the second layer; and
a conductive layer formed over the at least one layer that has a first portion that forms part of the first organic light-emitting diode pixel and a second portion, wherein the second portion is electrically isolated from the first portion by a void that is at least partially defined by an undercut in the at least one layer.

2. The display defined in claim 1, wherein the non-orthogonal angle is less than 90 degrees.

3. The display defined in claim 1, wherein the non-orthogonal angle is between 45 degrees and 90 degrees.

4. The display defined in claim 1, wherein the non-orthogonal angle is between 10 degrees and 45 degrees.

5. The display defined in claim 1, wherein the at least two layers comprise a third layer that is formed over the second layer, wherein the second layer is interposed between the first layer and the third layer, and wherein the edge surface is not directly overlapped by the third layer.

6. The display defined in claim 5, wherein the first and third layers comprise silicon dioxide and wherein the second layer comprises silicon nitride.

7. The display defined in claim 1, wherein the first layer comprises silicon dioxide.

8. The display defined in claim 1, wherein the first layer is in direct contact with the upper surface of the first patterned electrode.

9. The display defined in claim 8, wherein the first layer is in direct contact with an edge of the first patterned electrode.

10. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a first layer that is formed on the first patterned electrode and that has an edge surface at a non-orthogonal angle relative to an upper surface of the first patterned electrode;
a second layer that is formed on an upper surface of the first layer; and
a third layer that is formed on the second layer, wherein the first, second, and third layers collectively define an undercut.

11. The display defined in claim 10, further comprising:
a conductive layer formed over the third layer that has a first portion that forms part of the first organic light-emitting diode pixel and a second portion, wherein the second portion is electrically isolated from the first portion by a void that is at least partially defined by the undercut.

12. The display defined in claim 10, wherein the first and third layers comprise silicon dioxide.

13. The display defined in claim 12, wherein the second layer comprise silicon nitride.

14. The display defined in claim 10, wherein the first and third layers comprise a first material and wherein the second layer comprises a second material that is different than the first material.

15. The display defined in claim 10, wherein the non-orthogonal angle is less than 90 degrees.

16. The display defined in claim 10, wherein an edge of the third layer extends past an edge of the second layer towards a center of the first patterned electrode.

17. The display defined in claim 10, wherein the undercut has a height that is a distance between the upper surface of the first layer and a lower surface of the third layer.

18. The display defined in claim 10, wherein the third layer is formed on an upper surface of the second layer.

19. A display comprising:
a substrate;
an array of pixels that includes first and second pixels, wherein the first pixel includes a first patterned electrode on the substrate and wherein the second pixel includes a second patterned electrode on the substrate;
three layers on the substrate that are interposed between the first and second patterned electrodes, wherein three layers comprise a first layer that is formed on the first patterned electrode and that has an edge surface at a non-orthogonal angle relative to an upper surface of the first patterned electrode, wherein the three layers comprise a second layer and a third layer, wherein the second layer is interposed between the first and third layers, and wherein an edge of the third layer extends past an edge of the second layer towards a center of the first patterned electrode; and
a conductive layer formed over the at least one layer that has a discontinuity caused by an undercut in the at least one layer.

20. The display defined in claim 19, wherein the non-orthogonal angle is less than 90 degrees.

* * * * *

UNITED STATES PATENT AND TRADEMARK OFFICE
CERTIFICATE OF CORRECTION

PATENT NO. : 12,108,632 B2
APPLICATION NO. : 18/193999
DATED : October 1, 2024
INVENTOR(S) : Jaein Choi et al.

It is certified that error appears in the above-identified patent and that said Letters Patent is hereby corrected as shown below:

In the Claims

Column 14, Line 22, "comprise" should read -- comprises --

Column 14, Line 44, "wherein three" should read -- wherein the three --

Signed and Sealed this
Twelfth Day of November, 2024

Katherine Kelly Vidal
*Director of the United States Patent and Trademark Office*